United States Patent
Eilert et al.

(10) Patent No.: US 7,692,284 B2
(45) Date of Patent: Apr. 6, 2010

(54) PACKAGE USING ARRAY CAPACITOR CORE

(75) Inventors: Kimberly D. Eilert, Mesa, AZ (US);
Kaladhar Radhakrishnan, Chandler, AZ (US); Kemal Aygun, Chandler, AZ (US); Michael J. Hill, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 21 days.

(21) Appl. No.: 11/301,470

(22) Filed: Dec. 12, 2005

(65) Prior Publication Data

US 2007/0134925 A1    Jun. 14, 2007

(51) Int. Cl.
*H01L 23/52* (2006.01)
(52) U.S. Cl. .................. 257/691; 257/690; 257/723; 257/778; 257/E23.062
(58) Field of Classification Search .......... 257/778, 257/723–724, 690–691, 678; 438/612–624, 438/637–638, 672–673
See application file for complete search history.

(56) References Cited

U.S. PATENT DOCUMENTS

| | | | |
|---|---|---|---|
| 6,346,743 B1 | 2/2002 | Figueroa | |
| 6,351,369 B1* | 2/2002 | Kuroda et al. | 361/306.3 |
| 6,407,929 B1* | 6/2002 | Hale et al. | 361/763 |
| 7,216,422 B2* | 5/2007 | Fan et al. | 29/832 |
| 2005/0104221 A1 | 5/2005 | Memis | |
| 2005/0136608 A1 | 6/2005 | Mosley | |
| 2005/0248015 A1 | 11/2005 | Palanduz | |
| 2006/0115951 A1* | 6/2006 | Mosley | 438/381 |
| 2007/0076391 A1* | 4/2007 | Hsu | 361/763 |

FOREIGN PATENT DOCUMENTS

| | | |
|---|---|---|
| WO | WO 02/03463 A | 1/2002 |
| WO | WO 02/11206 A | 2/2002 |

* cited by examiner

*Primary Examiner*—Dung A. Le
(74) *Attorney, Agent, or Firm*—Blakely, Sokoloff, Taylor & Zafman LLP

(57) ABSTRACT

An embodiment of the present invention is a technique to fabricate a package substrate. The package substrate includes top substrate layers, an array capacitor, and bottom substrate layers. The top substrate layers embed micro-vias. The micro-vias have a micro-via area and provide electrical connections between the top substrate layers. The array capacitor structure is placed in contact with the micro-via area. The array capacitor structure is electrically connected to the micro-vias. The bottom substrate layers are formed on the array capacitor structure.

18 Claims, 9 Drawing Sheets

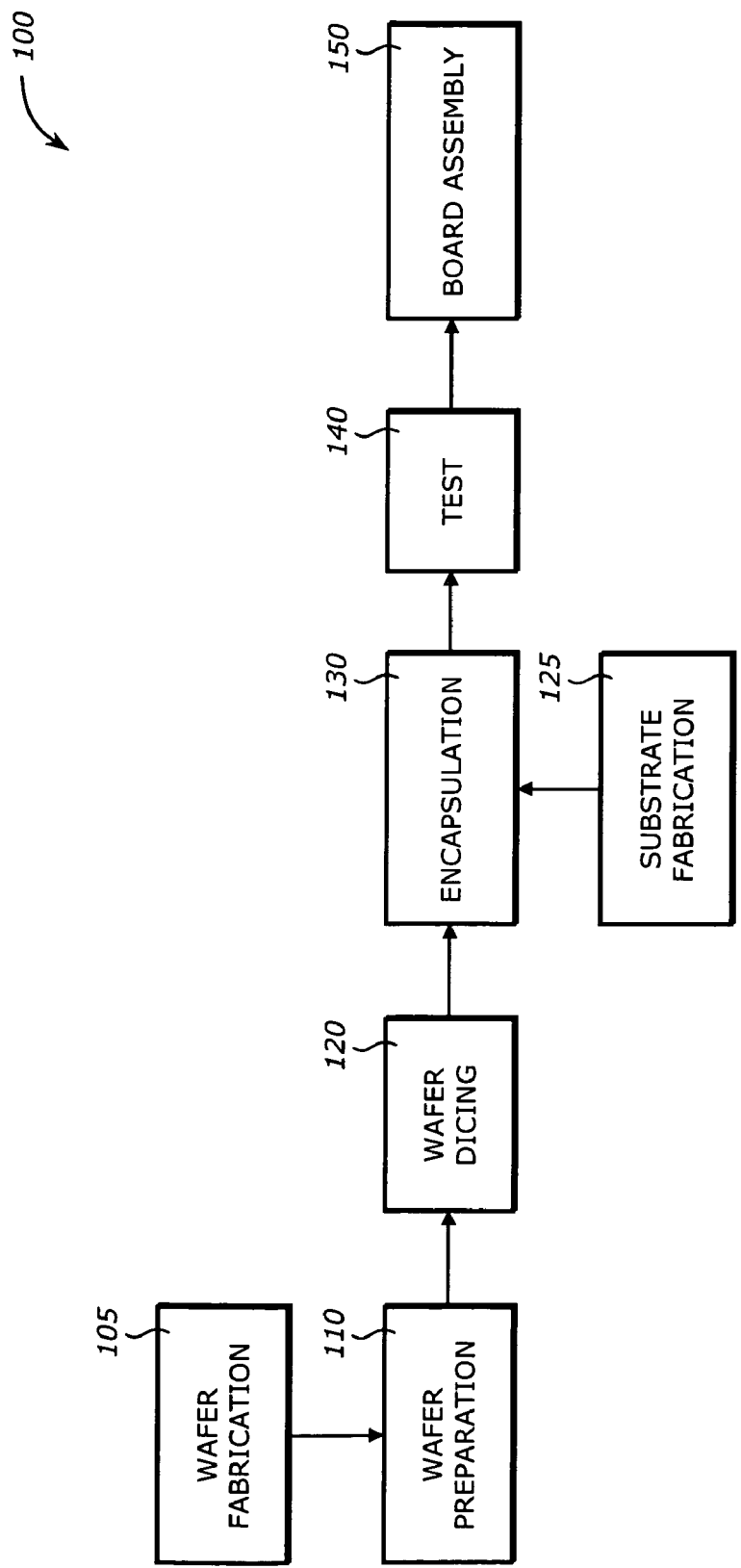

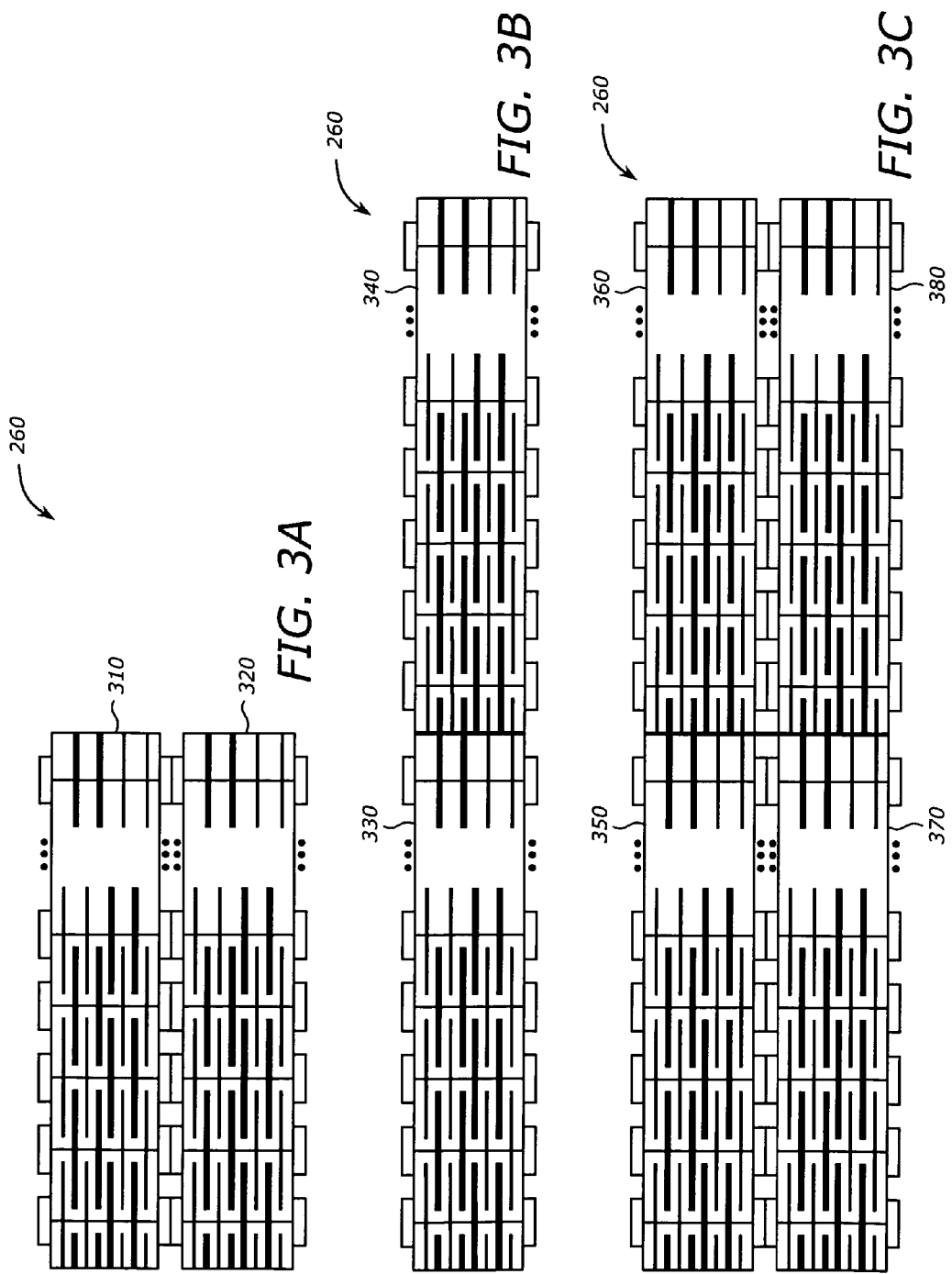

PACKAGE USING ARRAY CAPACITOR CORE

BACKGROUND

1. Field of the Invention

Embodiments of the invention relate to the field of semiconductor, and more specifically, to semiconductor packaging.

2. Description of Related Art

Power delivery networks (PDNs) have been designed with many individual capacitors to attain the low equivalent series inductance (ESL) needed to manage high frequency impedance resonances. Currently, PDNs may achieve even lower values of ESL through the use of external array capacitors. However, the overall effectiveness of a capacitor is determined by the sum of its ESL and the inductance of the connection between the capacitor and the current source.

Existing techniques using external array capacitors have a number of drawbacks. One technique places the array capacitors on the land-side of the package. This technique uses long, broadly spaced plated through hole (PTH) connections between the capacitors and the silicon die. The PTH connections pass through the large core layer. Due to the long distance between the capacitors and the die, the interconnect inductance becomes significant, resulting in poor ESL. Other techniques use coreless or thin-core technologies, or fine pitch interconnect through the core. These techniques increase the risk of mechanical failure. In addition, the reduction of the interconnect inductance may be inadequate in many applications.

BRIEF DESCRIPTION OF THE DRAWINGS

Embodiments of invention may best be understood by referring to the following description and accompanying drawings that are used to illustrate embodiments of the invention. In the drawings:

FIG. 1 is a diagram illustrating a manufacturing process in which one embodiment of the invention may be practiced.

FIG. 3A is a diagram illustrating the array capacitor structure having stacked array capacitors according to one embodiment of the invention.

FIG. 3B is a diagram illustrating the array capacitor structure having adjacent array capacitors according to one embodiment of the invention.

FIG. 3C is a diagram illustrating the array capacitor structure having stacked and adjacent array capacitors according to one embodiment of the invention.

DESCRIPTION

Figure 2A:
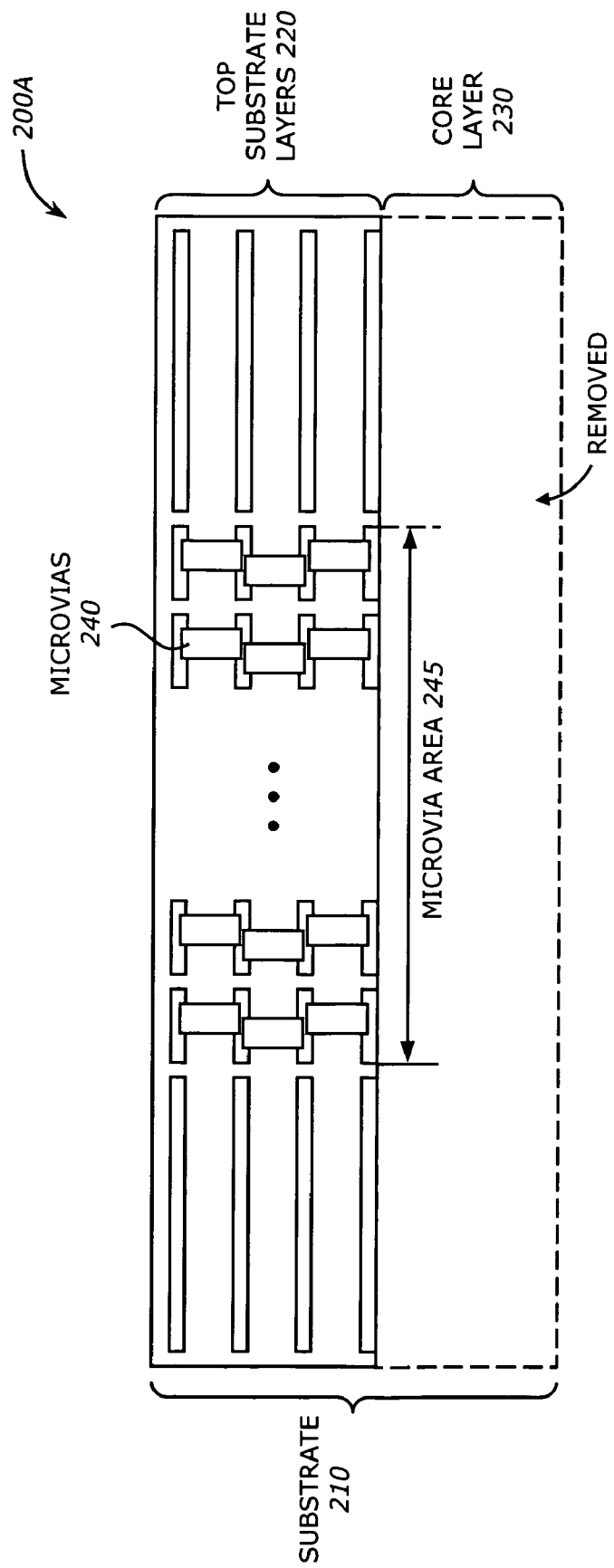
FIG. 2A is a diagram illustrating a process to drill or etch a substrate according to one embodiment of the invention.

An embodiment of the present invention is a technique to fabricate a package substrate. The package substrate includes top substrate layers, an array capacitor, and bottom substrate layers. The top substrate layers embed micro-vias. The micro-vias have a micro-via area and provide electrical connections between the top substrate layers. The array capacitor structure is placed in contact with the micro-via area. The array capacitor structure is electrically connected to the micro-vias. The bottom substrate layers are formed on the array capacitor structure In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

One embodiment of the invention is a technique to fabricate a package substrate. An array capacitor structure replaces core of the substrate. It may be contained within the package core or replace the core. The array capacitor structure may include one or more array capacitors. Interconnect inductance is typically proportional to the loop area of the power and ground connections between the capacitor(s) and the current source. Traditionally, this area is affected by the pitch of the plated through hole (PTH) vias and the distance between the die and the capacitors. By placing the array capacitors within or as the core, the capacitor connectivity may be entirely through the micro-vias. Therefore, PTH vias may not be needed, resulting in decreased interconnect inductance. In addition, the overall distance between the array capacitors and the die may be reduced significantly, leading to further reduction of interconnect inductance.

FIG. 1 is a diagram illustrating a system 100 in which one embodiment of the invention may be practiced. The system 100 includes a wafer fabrication phase 105, wafer preparation phase 110, a wafer dicing phase 120, a substrate fabrication phase 125, an encapsulation phase 130, a testing phase 140, and a board assembly phase 150. The system 100 represents a manufacturing flow of a semiconductor packaging process.

The wafer fabrication phase 105 fabricates the wafer containing a number of dice. The individual dice may be any microelectronic devices such as microprocessors, memory devices, interface circuits, etc. The wafer fabrication phase 105 includes typical processes for semiconductor fabrication such as preparation of the wafer surface, growth of silicon dioxide ($SiO_2$), patterning and subsequent implantation or diffusion of dopants to obtain the desired electrical properties, growth or deposition of a gate dielectric, and growth or deposition of insulating materials, depositing layers of metal and insulating material and etching it into the desired patterns. Typically the metal layers consist of aluminium or more recently copper. The various metal layers are interconnected by etching holes, called "vias," in the insulating material.

The wafer preparation phase 110 prepares a wafer containing dice for packaging and testing. During this phase, the wafers are sorted after the patterning process. An inspection may be carried out to check for wafer defects. Then, the wafer may be mounted on a backing tape that adheres to the back of the wafer. The mounting tape provides mechanical support for handling during subsequent phases.

The wafer dicing phase 120 dices, cuts, or saws the wafer into individual dice. High precision saw blade and image recognition unit may be used. De-ionized water may be dispensed on the wafer to wash away any residual particles or contaminants during the dicing. Then, the wafer is dried by being spun at high spinning speed.

The substrate fabrication phase 125 fabricates, constructs, or manufactures the package substrates to be used in the encapsulation phase 130. The package substrates have internal array capacitors as core layer to reduce interconnect inductance and enhance interconnect reliability.

The encapsulation phase 130 encapsulates the dice and the package substrates. The dice may be homogeneous or heterogeneous. The package substrates are provided by the substrate fabrication phase 125 to contain an array capacitor structure as described in the following. Integrated heat spreader (IHS) may be attached to the die and substrate assembly. The encapsulated assembly of the dice and substrate layers becomes a package ready to be tested.

The testing phase 140 performs one or more tests on the package under various conditions. The test may be highly accelerated stress test (HAST) or biased-HAST. The package may be powered or non-powered. The testing phase 140 may be optional.

The board assembly phase 150 assembles the package into a printed circuit board. This phase attaches the device package to the board. This phase may include various soldering processes, reflow, testing, and inspection. The assembled board is then installed into a platform in a system or unit.

FIG. 2A is a diagram illustrating a process 200A to drill or etch a substrate according to one embodiment of the invention. The process 200A starts with a substrate 210 that contains top substrate layers 220 and a core layer 230. The substrate 210 is made of any suitable substrate material such as silicon, epoxy, or polymeric material. The top substrate layers 220 are at the top of the substrate near the surface on which a die may be attached. The top substrate layers 220 embed a number of micro-vias 240. The micro-vias 240 provide electrical connections between the various layers in the substrate 210 including the top substrate layers 220. The micro-vias 240 occupy a micro-via area 245. The core layer 230 typically occupies at the core or the center of the substrate 210.

The process 200A drills or etches the core layer 230 to remove most or all of the core layer 230. The drilling or etching may be carried out using any suitable drilling or etching technique such as photo-imaging or laser. The drilling or etching may be optional if the substrate 210 starts out with the top substrate layers 220 only.

Figure 2B:
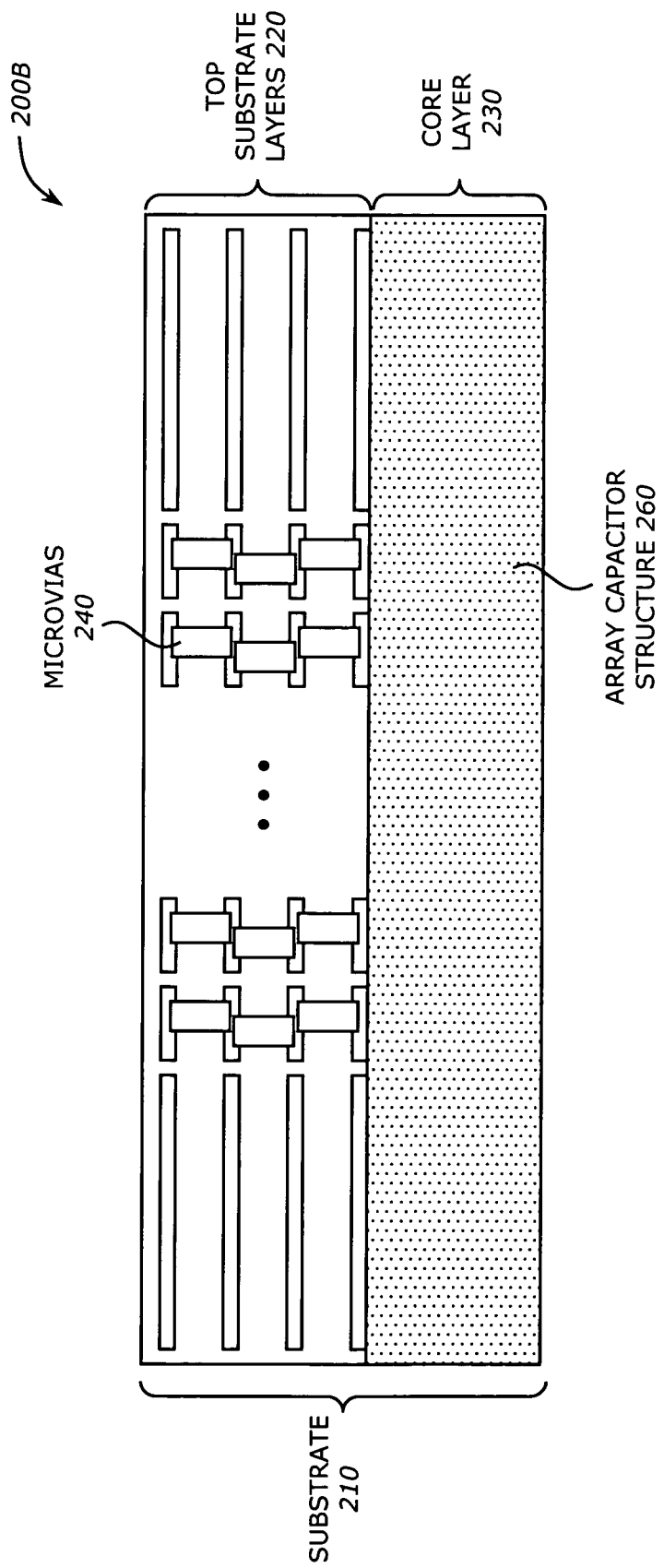
FIG. 2B is a diagram illustrating a process to place an array capacitor structure according to one embodiment of the invention.

FIG. 2B is a diagram illustrating a process 200B to place an array capacitor structure according to one embodiment of the invention. The process 200B starts by placing, depositing, inserting, or positioning an array capacitor structure 260 in the opening area. The array capacitor structure 260 includes array capacitors that are selected to provide an appropriate low equivalent series inductance (ESL) to support the operation of the die that is attached to the substrate package. The array capacitor structure 260 may include off-the-shelf array capacitors or may be fabricated during the process 200B. The array capacitor structure 260 may occupy the entire core layer 230 as a replacement for the core layer 230. The array capacitor structure 260 has electrical connections to connect to the micro-vias 240 or to other interconnecting points such as power or ground in the package substrate.

Figure 2C:
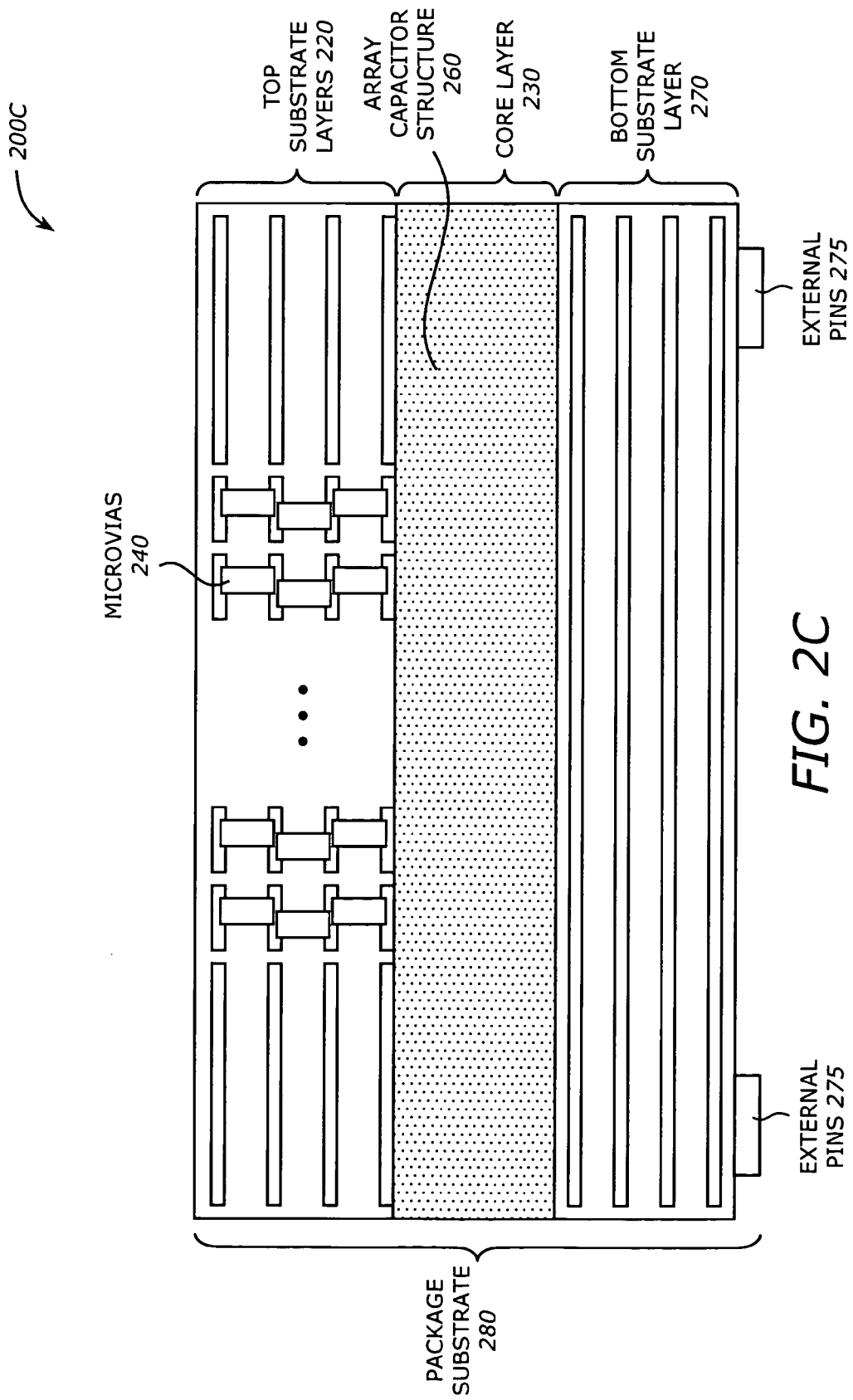
FIG. 2C is a diagram illustrating a process to form bottom substrate layers according to one embodiment of the invention.

FIG. 2C is a diagram illustrating a process 200C to form bottom substrate layers according to one embodiment of the invention. The process 200C forms bottom substrate layers 270 to provide electrical paths for interconnections with various components in the substrate package. The process 200C may also form electrical contact points, pads, or pins 275 at the bottom of the package substrate. The bottom substrate layers 270 may be embedded in a substrate material and provide electrical connections to various parts in the package substrate include the array capacitor structure 260 and other external components such as external pads or pins 275.

The formation of the bottom substrate layers 270 results in a package substrate 280 that may be ready to attach to a die. The package substrate 280 thus includes the top substrate layers 220 embedding the micro-vias 240, the array capacitor structure 260 placed in contact with the micro-via-area 245, and the bottom substrate layers 270 formed on the array capacitor structure 260. As noted above, the micro-vias 240 have the micro-via area 245 and providing electrical connections between top substrate layers 220. The array capacitor structure 260 is electrically connected to the micro-vias 240. It may also is electrically connected to the bottom substrate layers 270.

Figure 2D:
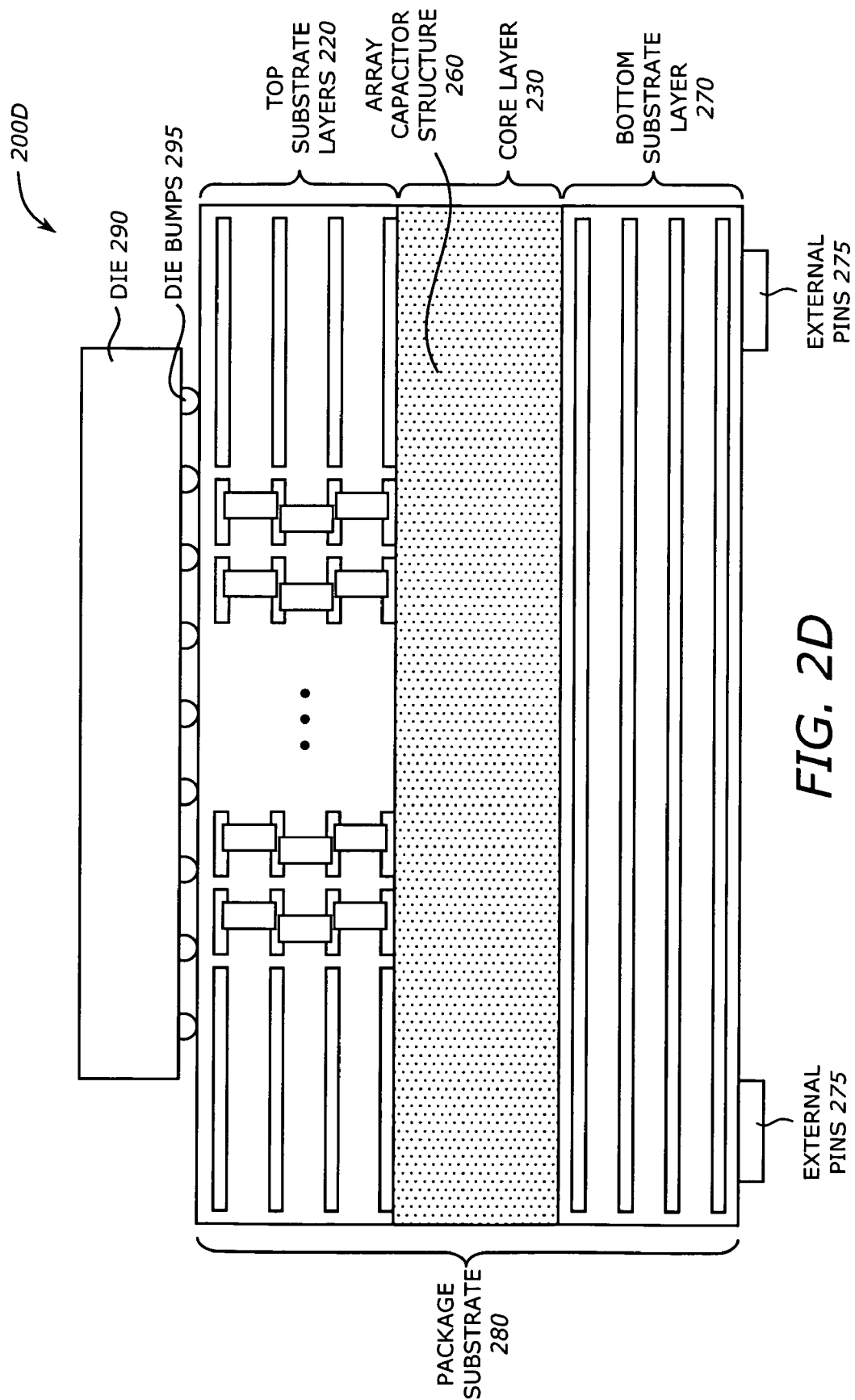
FIG. 2D is a diagram illustrating a process to attach a die to the package substrate according to one embodiment of the invention.

FIG. 2D is a diagram illustrating a process 200D to attach a die 290 to the package substrate according to one embodiment of the invention. The process 200D starts by aligning the die 290 with the attachment contacts on the top surface of the package substrate 280. The attachment contacts may be contact pads or package substrate bumps. The substrate bumps may be coined to achieve a suitable co-planarity. The die 290 may be any integrated circuit, chip, device, or microelectronic device that may have been cut or diced from a wafer. The die 290 has die bumps 295. The process 200D may include pre-soldering and reflowing the die bumps 285 and the substrate bumps to attach the die 290 to the package substrate 280. The pre-soldering and reflowing may be carried out using any suitable pre-soldering and reflowing techniques. Other processes may be performed including placing an IHS on the die and substrate assembly, dispensing under-fill material, curing, etc. The process 2D completes the assembly of the die and the package substrate to form an integrated circuit package. The integrated circuit package may be tested and assembled in to a printed circuit board.

The array capacitor structure 260 may be formed by a single composite array of capacitors or a number of array capacitors. When more than one array is used, they may be combined by stacking, placing next to one another, or a combination of stacking and adjacent placement. These array capacitors may be homogeneous or heterogeneous depending on various factors such as layout constraints, performance and/or manufacturing requirements, and cost trade-offs. Typically, they are connected in parallel between power and ground. They may provide capacitance values of 50 μF, or any suitable range.

FIG. 3A is a diagram illustrating the array capacitor structure 260 having stacked array capacitors according to one embodiment of the invention. The array capacitor structure 260 may include a number of array capacitors stacked on each other. For example, it may include array capacitors 310 and 320. The array capacitors 310 are stacked on the array capacitors 320 in a vertical direction. Any number of stacking levels may be employed depending on the size, thickness, or height of the array capacitors.

FIG. 3B is a diagram illustrating the array capacitor structure 260 having adjacent array capacitors according to one embodiment of the invention. The array capacitor structure 260 may include any number of array capacitors placed adjacent to one another. For example, it may include array capacitors 330 and 340 placed adjacent to each other in a horizontal direction. Any number of array capacitors may be placed next to each other depending on the length of the array capacitors.

FIG. 3C is a diagram illustrating the array capacitor structure 260 having stacked and adjacent array capacitors according to one embodiment of the invention. The array capacitor structure 260 may include a combination of stacking and adjacent placements of array capacitors. For example, it may include array capacitors 350 and 360 placed adjacent to each other, and array capacitors 370 and 380 stacked on array capacitors 350 and 360, respectively. Any number of array capacitors may be stacked or placed next to each other depending on the size (e.g., length, height) of the array capacitors.

Figure 4:
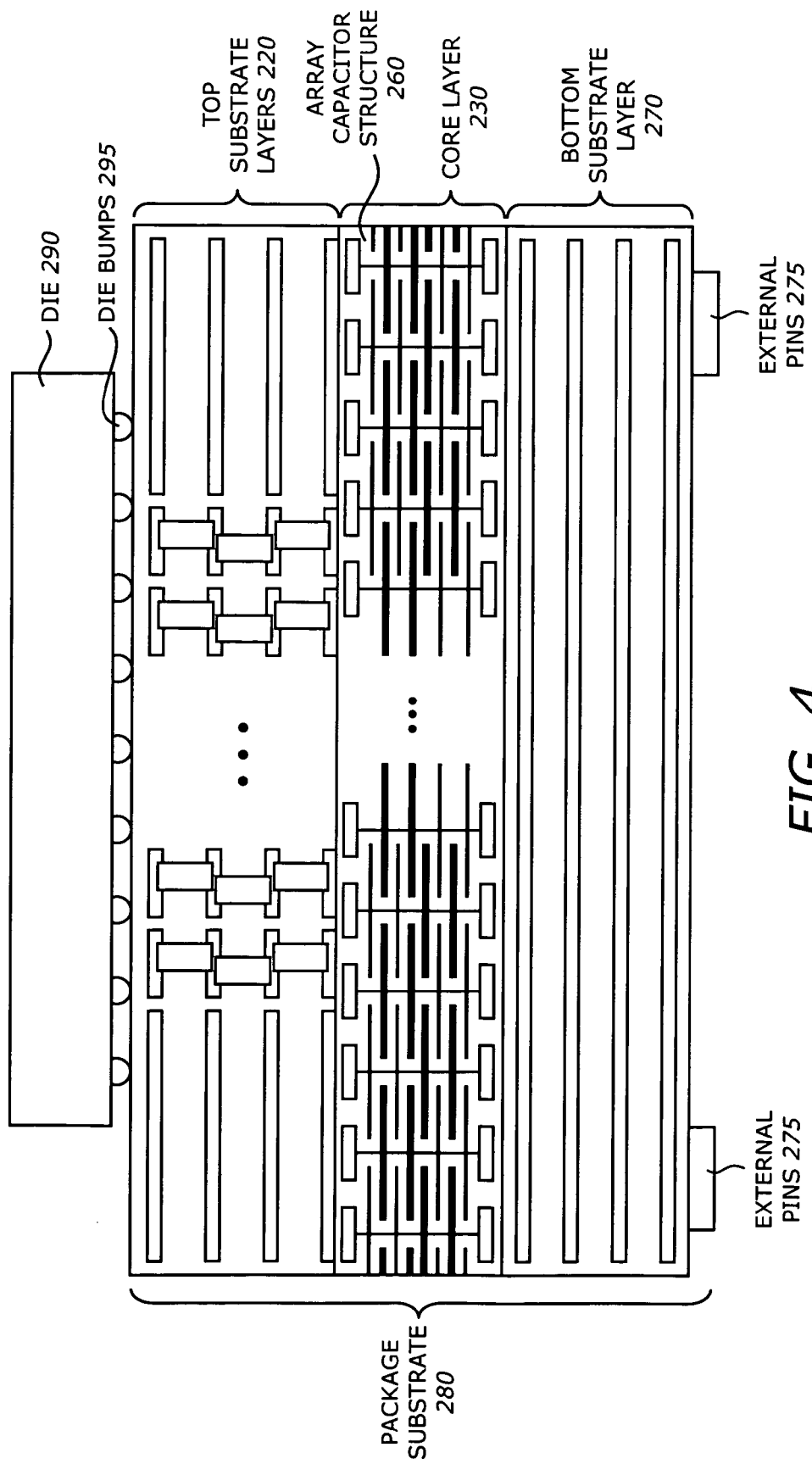
FIG. 4 is a diagram illustrating array capacitor structure as package core according to one embodiment of the invention.

FIG. 4 is a diagram illustrating the array capacitor structure 260 as the package core according to one embodiment of the invention. The array capacitor structure 260 may occupy a substantial portion of the core layer or may replace the entire core such that it may act a as the core layer itself.

The array capacitor structure 260 has electrical connections to various layers in the package so that signals and power connections may be routed within the substrate. It therefore may replace the PTH vias and provide robust interconnections. By placing the array capacitor structure 260 inside the package substrate, the distance between the die and the array capacitors is significantly reduced, resulting in low equivalent series inductance. This reduction leads to high performance in high frequency operating region of the die.

Figure 5:
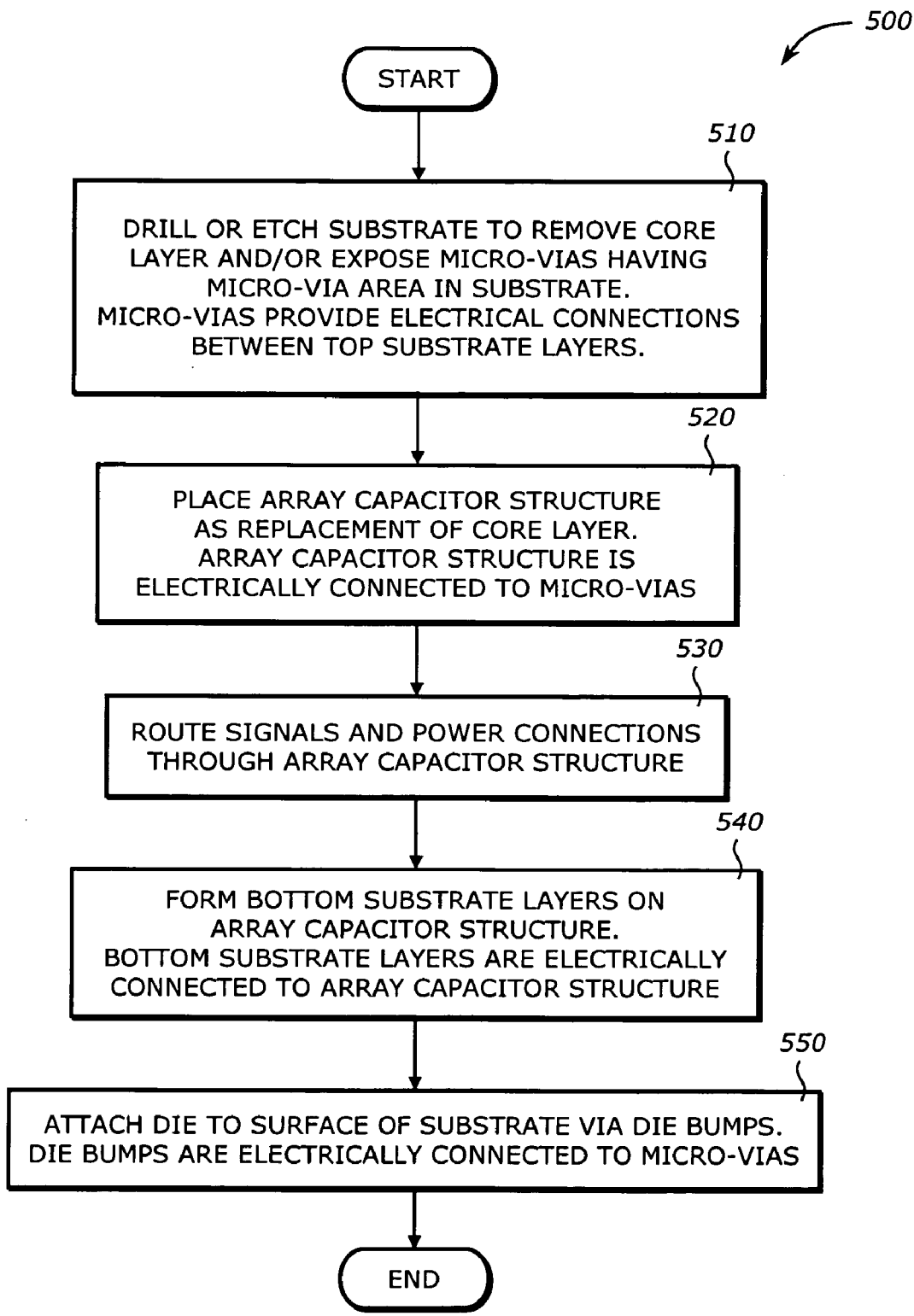
FIG. 5 is a flowchart illustrating a process to fabricate a package substrate according to one embodiment of the invention.

FIG. 5 is a flowchart illustrating a process 500 to fabricate a package substrate according to one embodiment of the invention.

Upon START, the process 500 drills or etches a substrate to remove a core layer and expose micro-vias having a micro-via area in the substrate (Block 510). The micro-vias provide electrical connections between top substrate layers. Next, the process 500 places an array capacitor structure to be in contact with the micro-via area (Block 520). The array capacitor structure is electrically connected to the micro-vias.

Then, the process 500 routes signals and power connections through the array capacitor structure (Block 530). These electrical connections provide connectivity of various contact points of the package substrate including the substrate bumps, power and ground. Next, the process 500 forms bottom substrate layers on the array capacitor structure (Block 540). The bottom substrate layers are electrically connected to the array capacitor structure. The bottom substrate layers may also be electrically connected to external contacts or pins at the bottom of the package substrate. Then, the process 500 attaches a die to surface of the substrate via die bumps (Block 550). The die bumps are electrically connected to the micro-vias through the substrate bumps on the top surface of the package substrate.

Figure 6:
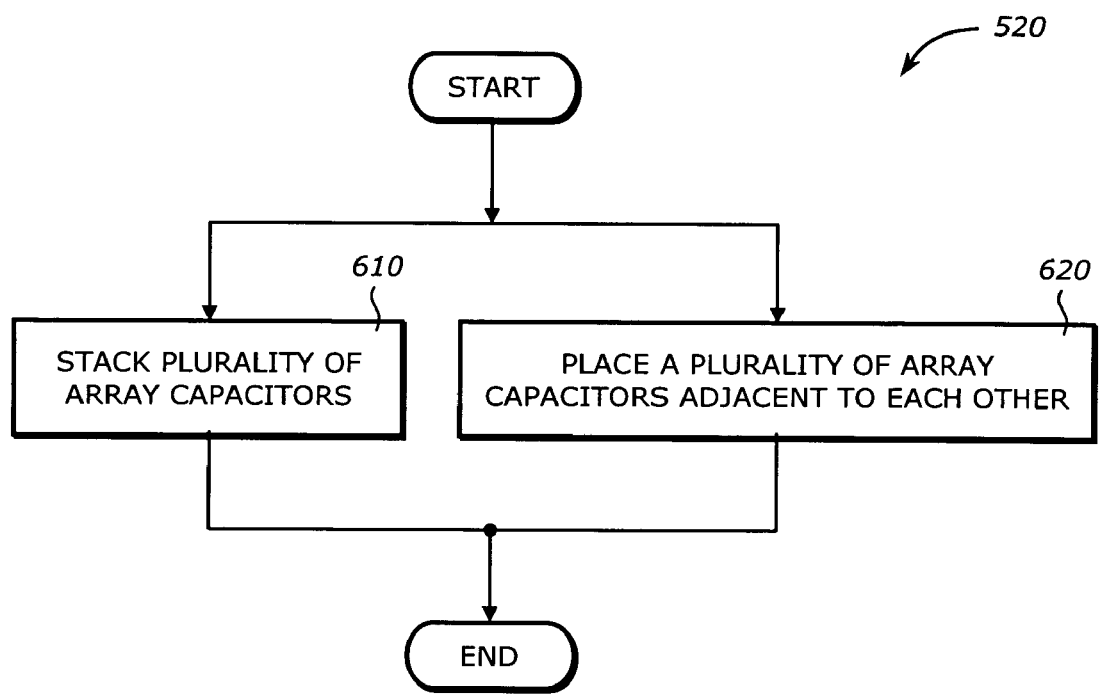
FIG. 6 is a flowchart illustrating a process to place the array capacitor structure according to one embodiment of the invention.

FIG. 6 is a flowchart illustrating a process 520 to place the array capacitor structure according to one embodiment of the invention. The process 520 may stack a plurality of array capacitors on each other (Block 610), or place a plurality of array capacitors adjacent to each other (Block 620). Any number of array capacitors may be combined or placed in the stacking or adjacent placements or a combination of both.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A package substrate comprising:
   top substrate layers having a top surface with attachment contacts for attachment to a semiconductor die to form a packaged device, the top substrate layers embedding micro-vias, the micro-vias having a micro-via area and providing electrical connections between the top substrate layers;
   an array capacitor structure placed in contact with the micro-via area, the array capacitor structure being electrically connected to the micro-vias; and
   bottom substrate layers formed on the array capacitor structure, the bottom substrate layers having electrical connection to at least an external pad or pin on the package substrate.

2. The package substrate of claim 1 wherein the array capacitor structure occupies a substantial portion or entire core of the substrate.

3. The package substrate of claim 1 wherein the away capacitor structure comprises a plurality of away capacitors stacked on one another.

4. The package substrate of claim 1 wherein the away capacitor structure comprises a plurality of away capacitors placed adjacent to each other.

5. The package substrate of claim 1 wherein the bottom substrates layers are electrically connected to the array capacitor structure.

6. The package substrate of claim 1 wherein the away capacitor structure comprises signals and power connections.

7. An integrated circuit package comprising:
   a die having die bumps; and
   a package substrate attached to the die via the die bumps, the package substrate comprising:
   top substrate layers having a top surface with attachment contacts for attachment to the die to form a packaged device, the top substrate layers embedding micro-vias, the micro-vias having a micro-via area and providing electrical connections between the top substrate layers,
   an array capacitor structure placed in contact with the micro-via area, the array capacitor structure being electrically connected to the micro-vias, and
   bottom substrate layers formed on the array capacitor structure, the bottom substrate layers having electrical connection to at least an external pad or pin on the package substrate.

8. The integrated circuit package of claim 7 wherein the array capacitor structure occupies a substantial portion or entire core of the substrate.

9. The integrated circuit package of claim 7 wherein the array capacitor structure comprises a plurality of array capacitors stacked on one another.

10. The integrated circuit package of claim 7 wherein the array capacitor structure comprises a plurality of array capacitors placed adjacent to each other.

11. The integrated circuit package of claim 7 wherein the bottom substrates layers are electrically connected to the array capacitor structure.

12. The integrated circuit package of claim 7 wherein the array capacitor structure comprises signals and power connections.

13. The integrated circuit package of claim 7 wherein the die bumps are electrically connected to the micro-vias.

14. A package substrate comprising:
top substrate layers having a top surface with attachment contacts for attachment to a semiconductor die to form a packaged device, the top substrate layers embedding micro-vias, the micro-vias having a micro-via area and providing electrical connections between the top substrate layers;
an array capacitor structure placed in contact with the micro-via area, the array capacitor being electrically connected to the micro-vias, formed by a single composite array of capacitors or a number of array capacitors, and occupying a substantial portion or entire core of a substrate; and
bottom substrate layers formed on the array capacitor structure, the bottom substrate layers having electrical connection to at least an external pad or pin on the package substrate.

15. The package substrate of claim 14 wherein the array capacitor structure comprises a plurality of array capacitors stacked on one another.

16. The package substrate of claim 14 wherein the array capacitor structure comprises a plurality of array capacitors placed adjacent to each other.

17. The package substrate of claim 14 wherein the bottom substrates layers are electrically connected to the array capacitor structure.

18. The package substrate of claim 14 wherein the array capacitor structure comprises signals and power connections.

* * * * *

UNITED STATES PATENT AND TRADEMARK OFFICE
CERTIFICATE OF CORRECTION

PATENT NO. : 7,692,284 B2  
APPLICATION NO. : 11/301470  
DATED : April 6, 2010  
INVENTOR(S) : Eilert et al.

Page 1 of 1

It is certified that error appears in the above-identified patent and that said Letters Patent is hereby corrected as shown below:

In column 6, at line 27 delete, "away" and insert --array--.

In column 6, at line 28 delete, "away" and insert --array--.

In column 6, at line 30 delete, "away" and insert --array--.

In column 6, at line 31 delete, "away" and insert --array--.

In column 6, at line 36 delete, "away" and insert --array--.

Signed and Sealed this  
First Day of March, 2011

David J. Kappos  
*Director of the United States Patent and Trademark Office*